(12) United States Patent
Kamal et al.

(10) Patent No.: US 6,794,764 B1
(45) Date of Patent: Sep. 21, 2004

(54) CHARGE-TRAPPING MEMORY ARRAYS RESISTANT TO DAMAGE FROM CONTACT HOLE INFORMATION

(75) Inventors: Tazrien Kamal, San Jose, CA (US); Mark T. Ramsbey, Sunnyvale, CA (US); Hidehiko Shiraiwa, San Jose, CA (US); Fred T K Cheung, San Jose, CA (US)

(73) Assignees: Advanced Micro Devices, Inc., Sunnyvale, CA (US); Fujitsu Limited, Kawasaki (JP)

( * ) Notice: Subject to any disclaimer, the term of this patent is extended or adjusted under 35 U.S.C. 154(b) by 132 days.

(21) Appl. No.: 10/382,726

(22) Filed: Mar. 5, 2003

(51) Int. Cl.[7] .................................... H01L 27/088
(52) U.S. Cl. ........................ 257/900; 257/E21.626; 257/E21.64
(58) Field of Search .................. 257/900, E21.64, 257/E21.626

(56) References Cited

U.S. PATENT DOCUMENTS

| | | | |
|---|---|---|---|
| 6,275,414 B1 | * 8/2001 | Randolph et al. | 365/185.05 |
| 6,349,052 B1 | * 2/2002 | Hofmann et al. | 365/63 |
| 6,420,237 B1 | * 7/2002 | Chang | 438/300 |
| 6,524,913 B1 | * 2/2003 | Lin et al. | 438/261 |
| 2003/0075738 A1 | * 4/2003 | Chang | 257/213 |
| 2003/0109104 A1 | * 6/2003 | Chen et al. | 438/262 |

FOREIGN PATENT DOCUMENTS

EP     1 263 050 A1   * 4/2002

* cited by examiner

*Primary Examiner*—David Nelms
*Assistant Examiner*—Andy Huynh
(74) *Attorney, Agent, or Firm*—Renner, Otto, Boisselle & Sklar LLP (57) ABSTRACT

The present invention relates to a memory array comprising a substrate and a plurality of bitlines having contacts and a plurality of wordlines intersecting the bitlines. A protective spacer is used to separate the bitline contacts from the wordlines adjacent to the bitline contacts to prevent damage caused during the formation of the bitline contacts. The present invention also relates to a method of forming the memory array.

20 Claims, 5 Drawing Sheets

CHARGE-TRAPPING MEMORY ARRAYS RESISTANT TO DAMAGE FROM CONTACT HOLE INFORMATION

FIELD OF THE INVENTION

The present invention relates to semiconductor devices and the fabrication thereof and, more particularly, to a device with reduced degradation resulting from the formation of bitline contacts.

BACKGROUND OF THE INVENTION

Flash memory is a type of electronic memory media which can be rewritten and hold its content without power. Flash memory devices generally have life spans from 100K to 300K write cycles. Unlike dynamic random access memory (DRAM) and static random access memory (SRAM) chips, in which a single byte can be erased, flash memory is typically erased and written in fixed multi-bit blocks or sectors. Evolving out of electrically erasable read only memory (EEPROM) chip technology, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal connected to a different word line, while all the flash cells in the array have their source terminals connected to a common source terminal. In operation, individual flash cells are addressed via the respective bit line and word line using peripheral decoder and control circuitry for programming (writing), reading or erasing functions.

Such single bit stacked gate flash memory cells are programmed by applying a voltage to the control gate and connecting the source to ground and the drain to a predetermined potential above the source. A resulting high electric field across the tunnel oxide causes a phenomenon called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a voltage is applied to the source, and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erase, and application of supplemental erase pulses to individual cells which fail the initial verification. Thereafter, the erased status of the cell is again verified, and the process continues until the cell or bit is successfully erased or the cell is marked as unusable.

Recently, dual bit flash memory cells have become much more prevalent. The dual bit memory cells are capable of storing two bits of information in a single memory cell. Recently, dual bit flash memory structures have been introduced that do not utilize a floating gate, such as an charge-trapping flash memory device that employs a polysilicon layer over the charge-trapping dielectric material layer for providing wordline connections. Conventional techniques do not address the characteristics associated with these types of devices.

When charge-trapping memory cells are utilized in a memory array, a charge-trapping dielectric material is formed over the substrate and a plurality of bitlines are formed in the substrate. Between the bitlines and above the charge-trapping dielectric material are formed a plurality of wordlines, generally polysilicon. When the cell is functioning properly, charges are trapped in the charge-trapping dielectric material. However, when contact holes are formed in the bitlines by contact edge tools, plasma charging can damage the dielectric charge-trapping material near the contact holes. Such damage might include the creation of charge trapping areas where none are intended. Consequently, the charge-trapping dielectric material near the contact holes may not trap charges in the same manner as dielectric material farther from the contact holes.

Therefore, there is an unmet need in the art for new and improved memory arrays which employ charge-trapping memory cells and are resistant to degradation resulting from contact hole formation.

SUMMARY OF THE INVENTION

According to the present invention, there is provided a memory array comprising a substrate and a plurality of bitlines having contacts. Between the bitlines are a plurality of charge-trapping memory cells with charge-trapping dielectric material formed over the substrate. A plurality of wordlines are formed over the charge-trapping dielectric material. Nitride spacers are formed between the bitline contacts and the wordlines adjacent to the bitline contacts.

Also according to the present invention, there is provided a method for forming a memory array. According to the method, a substrate is provided and a charge-trapping dielectric material is formed over the substrate. A plurality of bitlines having contact locations are formed and wordlines are formed over the charge-trapping dielectric material. Protective spacers are then formed between the bitline contacts locations and the wordlines adjacent to the bitline contact locations. The bitline contacts are then formed at the bitline contact locations.

DETAILED DESCRIPTION OF THE INVENTION

It should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. Furthermore, it should be appreciated that while the present invention will be described in terms of a two-bit charge-trapping device, the present invention is not limited to such device, and is applicable to all charge-trapping memory cells utilized in a memory array having bitline and wordlines architecture. It will also be understood that while the invention is described in terms of buried bitlines, the present invention is also applicable to other bitline configurations.

Figure 1:
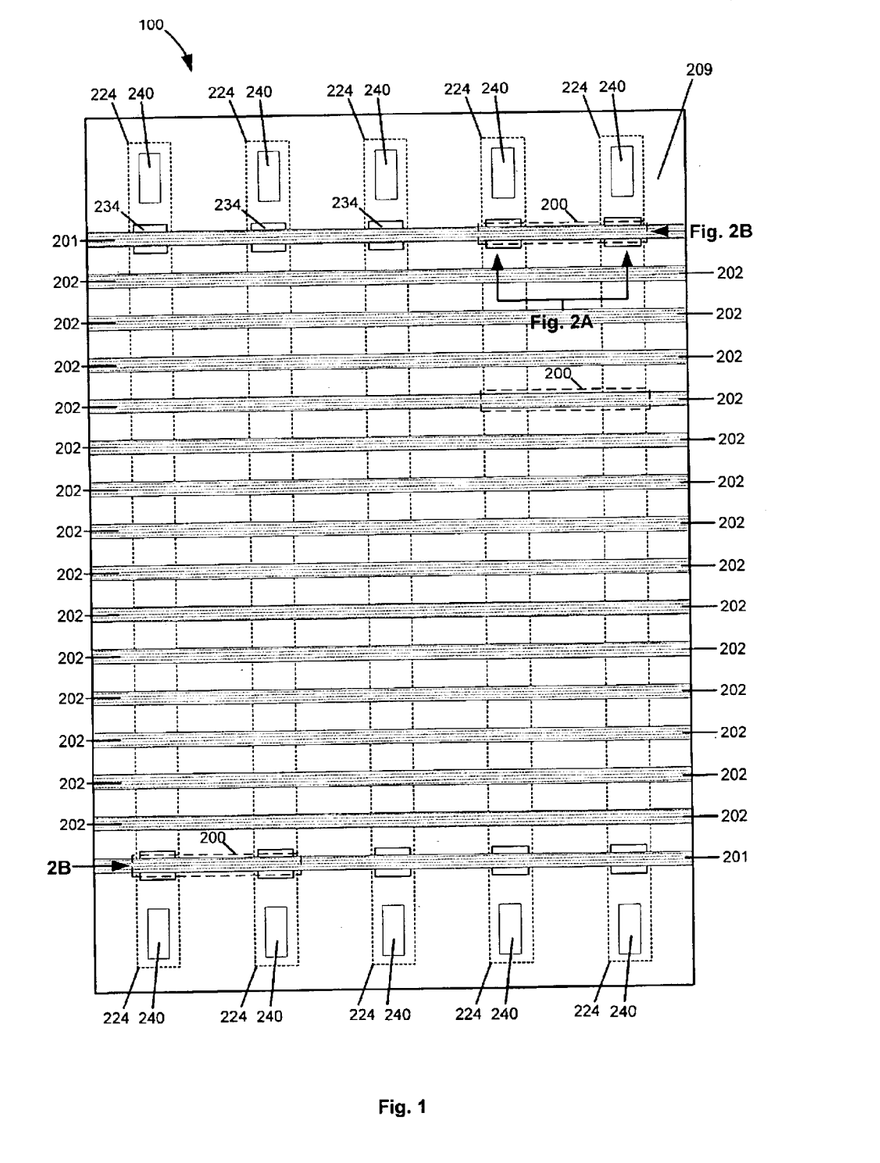
FIG. 1 illustrates a plan view of an array of charge-trapping memory having bitlines and wordlines in accordance with the present invention.

FIG. 1 illustrates a memory array having bitline and wordline architecture utilizing charge-trapping memory cells. The array 110 is illustrated in a top or plan view. As shown, the array 100 is an example of a 64K array 100 of, for example, 8 bit input/outputs (I/Os). It will be appreciated by those skilled in the art that the I/Os may be 16 bit, 32 bit, 64 bit or more. In addition, it will be appreciated that the array can be a memory block having a size of $2^{(n+1)}$K where n is greater than 0, such as 128K, 256K, etc. The array 100 can be a memory block that is a sector or a portion thereof. For example, a sector can be formed by one or more blocks having contacts 240 connecting common metal bitlines 224.

A charge-trapping dielectric stack 209 can extend the length of the memory array 100. The array 100 comprises 16 I/Os or groups of columns 224. Each "word" or group of I/O's is comprised of eight transistors or eight normal bits and eight complimentary bits. Each I/O includes a wordlines 201 or 202, which may be polysilicon, for addressing the rows of cells. A plurality of bitlines 224 run underneath the charge-trapping dielectric stack 209 for enabling reading, writing and erasing of individual bits of the memory cells 200. Each bitline 224 is connected to a first contact 240 and metal bitlines (not shown) at one end of a group of sixteen rows and a second contact 240 at the other end of the group. As shown in FIG. 1, five bit lines are illustrated such that a bitline may be tied to an end of every other transistor in a column and two select transistors may be used to select between four bits of two transistors for reading, writing and erasing. Between the each edge wordline 201 and contact 240 is a spacer 234. In one embodiment, the spacer 234 runs along the entire edge wordline 201. In one embodiment, the spacer 234 is placed only substantially above bitlines 224. In one embodiment, the spacer 234 extends beyond the edge wordline 201 by a distance that ranges from about 250 angstroms to about 1300 angstroms, and can extend such that it substantially spans the entire distance between the edge wordlines 201 and the contact 240.

Figure 2A:
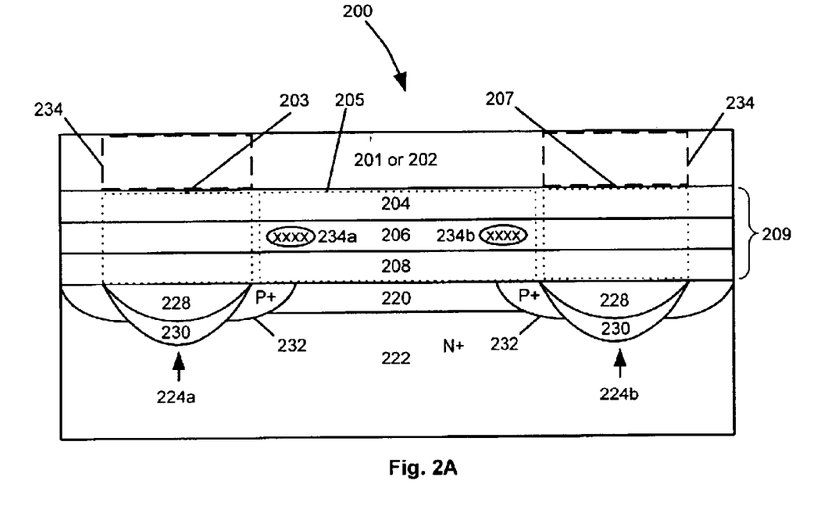
FIGS. 2A–B illustrate cross-sectional views of an exemplary charge-trapping memory cell in which various aspects of the present invention may be implemented; structure fabricated in accordance with the invention.
Figure 2B:
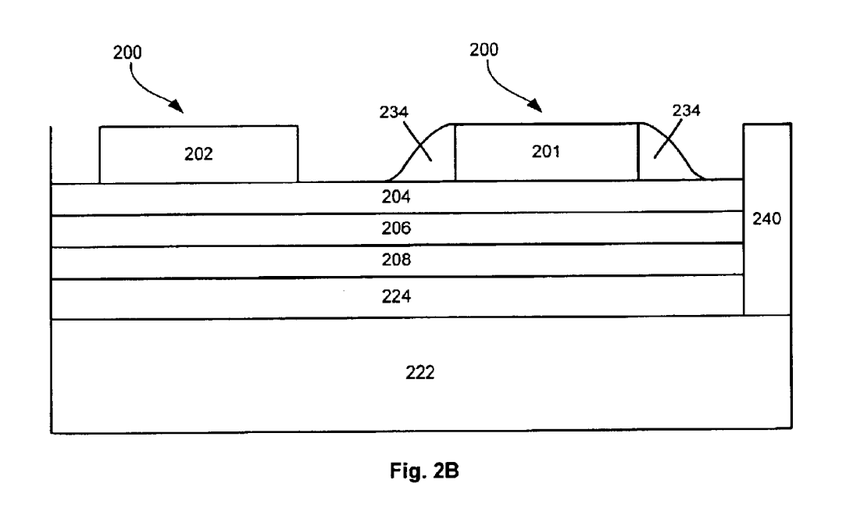

Turning now to FIGS. 2A and 2B, there is schematically shown in cross-section a memory cell in which one or more of the various aspects of the invention may be carried out. The memory cell 10 comprises a charge-trapping dielectric stack 209, which consists of charge-trapping layer 206 sandwiched between a top dielectric layer 204 and a bottom dielectric layer 208. A polysilicon layer 201 or 202 resides over the charge-trapping dielectric stack 209 and provides a wordline connection to the memory cell 200. A first bitline 224a runs underneath the charge-trapping dielectric stack 209 under a first region 203 and a second bitline 224b runs underneath the charge-trapping dielectric stack 209 under a second region 207. The bitlines 224a and 224b are formed of a conductive portion 230 and an optional oxide portion 228.

In one embodiment, boron core implants 232 are provided on both ends of each bitlines 224a and 224b where the bitlines meet the bottom dielectric layer 208 or along the entire transistor. The boron core implants are more heavily doped than a P-type substrate and assist in control of the VT of the memory cell 200. In one embodiment, the cell 200 resides on a P-type substrate 222 with the conductive portion 230 of the bitlines 224a and 224b being formed from an N+ arsenic implant, such that a channel 220 is formed between the bitlines 224a and 224b and across the P-type substrate. The memory cell 220 comprises interchangeable source and drain components formed from the N+ arsenic implant portions 230 residing on the P-type substrate region 222 with a gate formed as part of a polysilicon wordline 201 or 202. While the first and second bitlines 224a and 224b are illustrated with respect to a conductive portion 230 and an optional oxide portion 228, it is appreciated that the bitlines can be formed from a conductive portion alone.

In one embodiment, the charge-trapping layer 206 is silicon nitride. Programming of the cell is accomplished by applying voltages to the drain and the gate and grounding the source. The voltages generate electrical fields along the channel causing electrons to accelerate and jump from the substrate layer 222 into the charge-trapping layer. This jump is known as hot electron injection. Since the electrons gain the most energy at the drain, these electrons become trapped and remain stored in the charge-trapping layer 206 near the drain. The cell 200 is generally uniform and the drain and source are interchangeable. Since the charge-trapping layer is non-conducting, a first charge 234a can be injected into the charge-trapping layer 206 near a first end of the central region 205 and a second charge 234b can be injected into the charge-trapping layer 206 near a second end of the central region 205. In this manner, more than one charge can be stored in the charge-trapping layer 206, creating a dual-bit memory cell 200. It will be appreciated that more than two charges can also be stored in the charge-trapping layer 206 in the same manner, creating a memory cell 200 that is greater than two-bit.

As previously stated, the first charge 234a can be stored in the charge-trapping layer 206 at the first end of the central region 205 and the second 234b can be stored at the second end of the central region 205 such that two bits can reside per memory cell 200. The dual-bit memory cell 200 is generally symmetrical, thus the drain and the source are interchangeable. Thus, the first bitline 224a may serve as the drain terminal and the second bitline 224b as the source terminal when programming the left bit. Likewise, the second bitlines 224b may serve as the drain terminal and the first bitline 224a as the source terminal for programming the right bit.

Those skilled in the art will recognize that for proper functioning of a memory cell array of the type described above, the electrical charges 234a, 234b preferably remain isolated in the regions of the charge-trapping layer 206 to which it is initially introduced. Furthermore, those skilled in the art generally believe that damage to at least one of the charge-trapping dielectric stack 209 and the gate electrode 201 occurs during the process of forming the contact hole 240. It is believed that such damage may be caused by plasma charging from edge tools. Such damage might cause charges to become caught in the bottom dielectric layer 208 so that charges are not injected into the charge-trapping layer 206, thereby causing the memory cells 200 adjacent to the contact hole 240 to function improperly.

Figure 7:
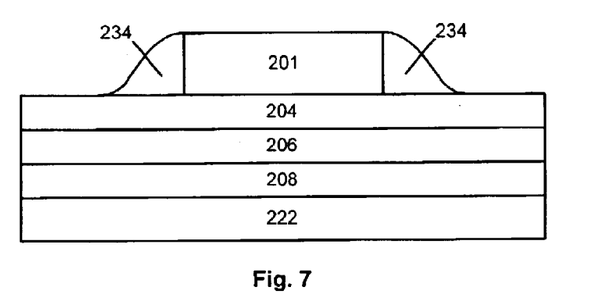
FIGS. 7 illustrates, in cross-section, a process step for the fabrication of a spacer in accordance with the invention.
Figure 8:
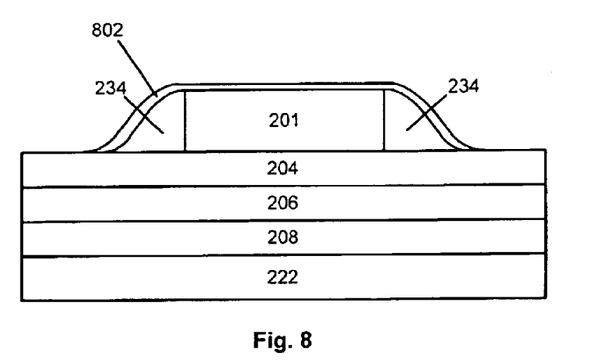
FIGS. 8 illustrates, in cross-section, a process step for the fabrication of an etch-stop in accordance with the invention.
Figure 9:
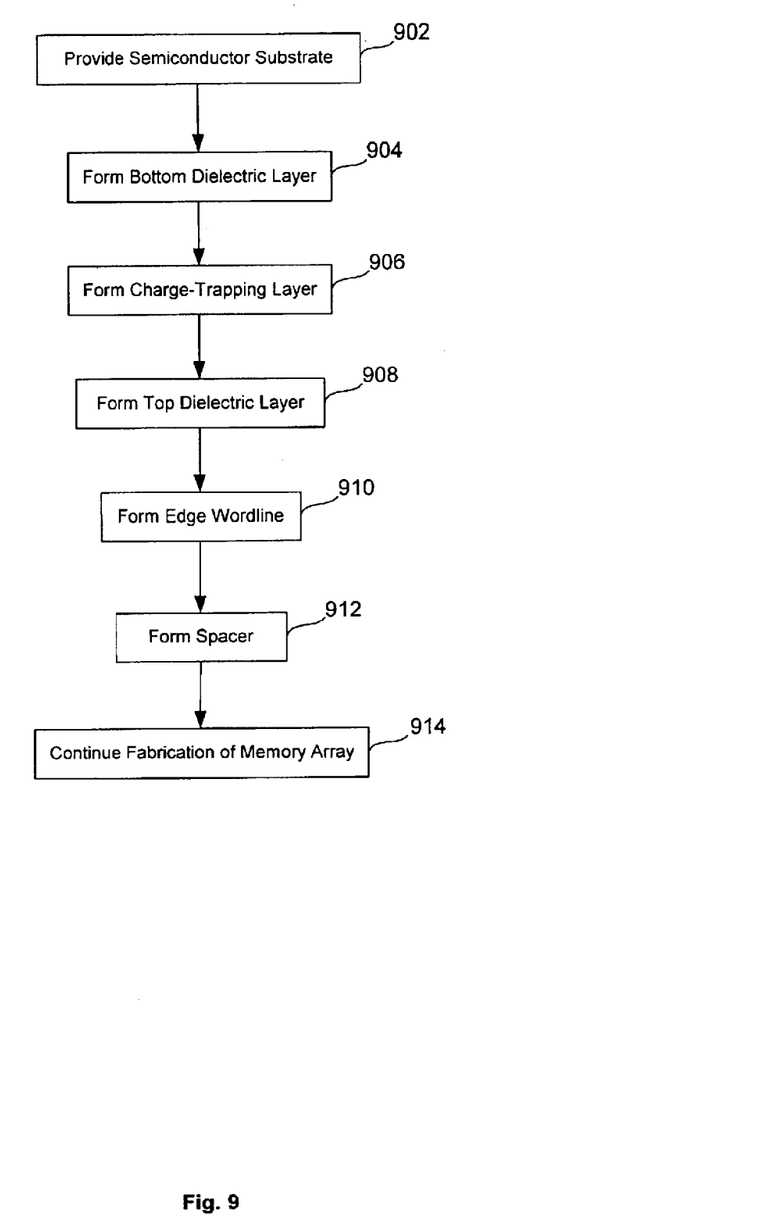
FIG. 9 is a schematic flow diagram generally illustrating steps of the present invention including the formation of the spacer.

The following description of the present invention follows with reference to FIGS. 3–8. FIGS. 3–6 illustrate, in cross-section, process steps for the fabrication of a charge-trapping dielectric stack 209 structure and an edge wordline 201 structure thereover, in accordance with the invention. FIGS. 7–8 illustrate, in cross-section process steps for the fabrication of a spacer and etch-stop layer in accordance with the present invention. FIG. 9 is a schematic flow diagram generally illustrating steps of processes in accordance with the present invention.

Figure 3:
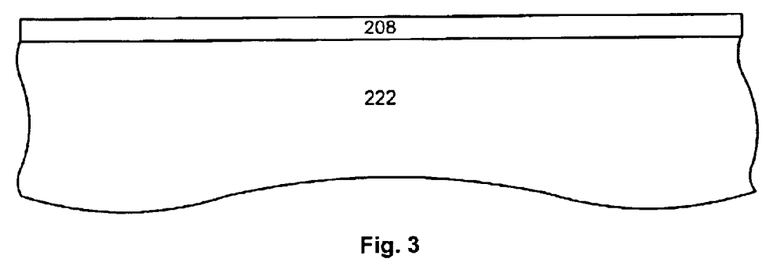
FIGS. 3–6 illustrate, in cross-section, process steps for the fabrication of a charge-trapping dielectric material structure and a wordline structure thereover in accordance with the invention.

In the first step of the present invention, shown schematically in FIG. 9 as step 902, a semiconductor substrate 222 is provided as shown in FIG. 3. The semiconductor substrate 222 can be any appropriately selected substrate known in the art. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particularly type of semiconductor substrate 222.

Still referring to FIG. 3, the formation of the bottom dielectric layer 208 is illustrated. This step is shown schematically in FIG. 9 as step 904. In accordance with the present invention, a bottom dielectric layer 208 is formed over the semiconductor substrate 222. In one embodiment, the bottom dielectric layer 208 is silicon dioxide. However, it will be appreciated by those skilled in the art that the bottom dielectric layer 208 is not limited to silicon dioxide. In one embodiment, the bottom dielectric layer 208 comprises a high-K dielectric material, a composite dielectric material, or a material substantially free of any high-K dielectric material. As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or more. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate ($BaTiO_3$), titanium dioxide ($TiO_2$), cerium oxide ($CeO_2$) lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric material. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

In one embodiment, the bottom dielectric layer 208 is formed by oxidation of the surface of the semiconductor substrate 222. The oxidation is suitably carried out by any appropriate oxidation process known in the art, such as in a rapid thermal process (RTP) apparatus of any type known in the art. For example, the RTP apparatus can be part of a single-wafer cluster tool. The bottom dielectric layer 208 can also be formed by a deposition process, such as a rapid-thermal-chemical-vapor-deposition (RTCVD) process. In one embodiment, the RTP apparatus is part of a single-wafer cluster tool. The bottom dielectric layer 208 can also be formed by depositing the dielectric material in a batch furnace by a low-pressure-chemical-vapor-deposition (LPCVD) process. In one embodiment, the bottom dielectric layer 208 is deposited by another suitable method, such as PECVD, ALD (ALCVD), PLD, MLD or MOCVD. The CVD method may be any appropriate CVD method known in the art.

The bottom dielectric layer 208 can have a thickness of from about 20 to about 150 angstroms. In one embodiment, the bottom dielectric layer 208 has a thickness of about 100 angstroms. As will be recognized by those skilled in the art, other known methods may be used for depositing the bottom dielectric layer 208. As a result of the foregoing step 904, by an appropriate method, the bottom dielectric layer 208 is formed.

Figure 4:
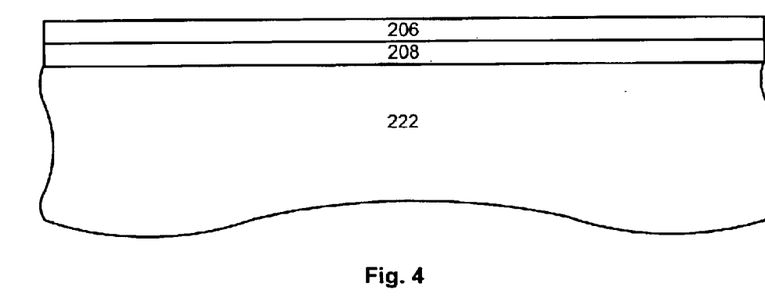

In the next step of the present invention, shown schematically in FIG. 9 as step 906, a charge-trapping layer 206 is formed over the bottom dielectric layer 208. As shown in FIG. 4, after forming the bottom dielectric layer 208, the charge-trapping layer 206 is deposited over the bottom dielectric layer 208. In one embodiment, the charge-trapping layer 206 comprises silicon nitride. In another embodiment, the charge-trapping layer 206 comprises a suitable high-K dielectric material. In another embodiment, the charging-trapping layer 206 comprises both a high-K dielectric material and a standard-K dielectric material, such as silicon nitride. In one embodiment, the layer 206 comprises a composite dielectric material, which comprises a composite or a reaction product of two or more dielectric materials, one of which is a high-K dielectric material and the other of which may be a standard-K dielectric material such as silicon nitride. Thus, in one embodiment, the high-K dielectric material completely replaces silicon nitride in the charge-trapping layer 206. In another embodiment, the high-K dielectric material is, in essence, added to or combined with, silicon nitride to form a charge-trapping layer 206. In another embodiment, the charge-trapping layer 206 includes a composite dielectric material which replaces silicon nitride. Suitable high-K dielectric materials for use in a high-K charge-trapping layer are disclosed in co-pending U.S. application Ser. No. 10/036,757 filed Dec. 31, 2001, which is incorporated herein by reference for its disclosure relating to high-K dielectric materials for use in a charge-trapping layer 206 of an charge-trapping dielectric stack 209.

Suitable methods for deposition of a high-K dielectric material layer include RTCVD, other chemical vapor deposition (CVD) methods, or any other appropriate method. The CVD method may be any appropriate CVD method known in the art for deposition of a high-K material. For example, the CVD method may be ALD (ALCVD), PECVD, MOCVD or MLD, in addition to the above-mentioned RTCVD.

Following deposition of the charge-trapping layer 206, in the next step of the process of fabricating the memory array 100, shown schematically in FIG. 9 as step 908, a top dielectric layer 204 is formed over the charge-trapping layer 206 by a suitable technique. The top dielectric layer 204 may comprise any of the materials disclosed above for the bottom dielectric layer 208. For example, the top dielectric layer 204 may comprise silicon dioxide, a high-K dielectric material or a composite dielectric material, as defined herein.

Figure 5:
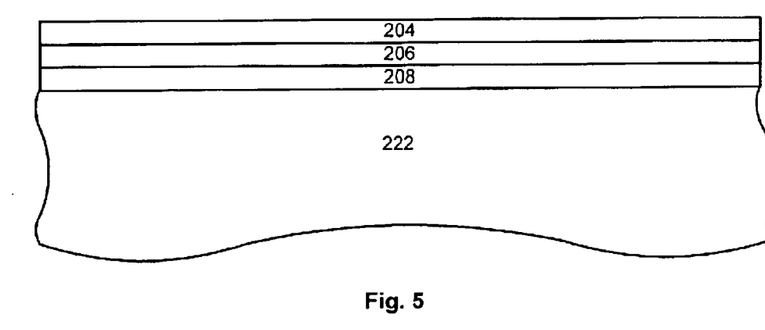
Figure 6:
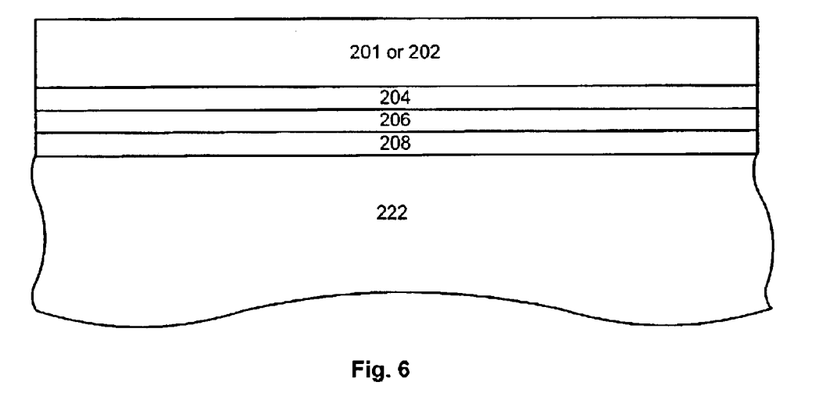

As shown in FIG. 5, after depositing the charge-trapping layer 206, the top dielectric layer 204 is formed over the charge-trapping layer 206. The top dielectric layer 204 may be formed by any appropriate method known in the art. In one embodiment, the top dielectric layer 204 is formed by an in-situ steam generation (ISSG) oxidation of the upper surface of the charge-trapping layer 206. In one embodiment, the top dielectric layer 204 is formed by an HTO deposition, such as the RTCVD or LPCVD methods described above. In one embodiment, the top dielectric layer 204 is deposited by another suitable method, such as PECVD, ALD (ALCVD), PLD, MLD or MOCVD. The CVD method may be any appropriate CVD method known in the art.

Thus, the charge-trapping dielectric material 209 is formed. It will be appreciated that the phases "charge-trapping dielectric material," "charge-trapping dielectric stack" and "charge-trapping dielectric structure" are meant to be used interchangeably.

As shown in FIG. 9 as step 908 following formation of the charge-trapping dielectric material 209 in accordance with the present invention, a wordline layer 201 or 202 is formed over the top dielectric layer 204. The same formation process is equally applicable to both wordlines 202 and edge wordlines 201. The layer forming the wordline 201 or 202 may comprise any material known in the art for such use. For example, the wordline layer 201 or 202 may comprise polysilicon, polysilicon-germanium, a metal silicide, a metal, or any other suitable material known in the art. A lithographic patterning and etching process may then be carried out to define the charge-trapping dielectric material 209 and wordline 201 or 202. Those skilled in the art will recognize that various gate-forming materials can be used to fabricate the wordline 201 or 202. For example, the wordline 201 or 202 can be formed with polycrystalline silicon, amorphous silicon, a refractory metal silicide, a metal, and the Following formation of the edge wordline 201, a protective spacer 234 is formed over charge-trapping dielectric material 209 and between the edge wordline 201 and the future location of the contact 240, as indicated in step 912 of FIG. 9. During the formation of the contact hole 240, plasma from edge tools can cause damage to the charge-trapping dielectric material 209 and the edge wordline 201. Therefore, prior to the formation of the contact hole 240, the protective spacer 234 is formed to help prevent damage, such as from plasma. In one embodiment, the spacer 234 is a nitride spacer. The nitride spacer can have stoichiometry of $Si_3N_4$. In addition, other materials can be used for the spacer 234, such as: silicon nitride, silicon rich nitride, SiOH etc. The spacer 234 protects the edge transistors from UV radiation from the contact etch. This prevents damage on the contact etch on the edge wordlines.

In one embodiment, the spacer 234 is formed by such as an RTCVD or LPCVD method. In one embodiment, the spacer 234 is deposited by another suitable method, such as PECVD, ALD, (ALCVD), PLD, MLD or MOCVD. The CVD method may be any appropriate CVD method known in the art. In one embodiment, a lithographic patterning and etching process may then be carried out to define the spacer 234. In one embodiment, the spacers 234 range from about 250 angstroms to about 1300 angstroms, and in one embodiment, from about 750 angstroms to about 1200 angstroms. In one embodiment, the spacers 234 are about the same height as the material deposited over the charge-trapping dielectric material to form the edge wordline 201.

In one embodiment, the spacer 234 is formed such that it abuts the wordline 201 and in one embodiment, the spacer 234 is separated from the wordline 201. In one embodiment, a single spacer 234 extends such that it separates the edge wordline 201 from the contacts 240 of more than one bitline 224 intersecting the edge wordline 201. In one embodiment, as illustrated in FIG. 8, an etch-stop layer 802 is formed over the wordline 201 and the spacer 234 prior to introducing the contact material. The contact material may be any contact material as understood by those in the art, such as cobalt silicide, $CoSi_2$ or titanium silicide, $TiSi_2$. In addition, the etch-stop layer may be any suitable material. In addition, the charge-trapping dielectric material 209 can be separated from the contact hole 240 by dielectric material, such an oxide layer, to provide further insulation from damage incurred during the creation of the contact hole.

There has been disclosed in accordance with the invention a charge-trapping memory array resistant to damage incurred during the formation of contacts and a process for fabricating the same. The present invention therefore provides a memory array having protective spacers formed between edge wordlines and bitline contacts. This provides a memory array that exhibits less bitline leakage.

Although the invention has been described and illustrated with reference to specific illustrative embodiments thereof, it is not intended that the invention be limited to those illustrative embodiments. Although described in terms of, and particularly applicable to, dual-bit devices, the present invention is broadly applicable to other memory arrays. For example, the process of the invention may also be applicable to forming a floating gate memory array. Those skilled in the art will recognize that variations and modifications can be made without departing from the spirit of the invention. For example, the thicknesses of the individual layers making up the charge-trapping dielectric structure can be varied from that described herein. It is therefore intended to include within the invention all such variations and modifications that fall within the scope of the appended claims and equivalents thereof.

What is claimed is:

1. A memory array comprising:
    a substrate;
    a plurality of bitlines having contacts;
    a plurality of memory cells, each memory cell located between two bitlines and comprising a charge-trapping dielectric material formed over the substrate;
    a plurality of wordlines formed over the charge-trapping dielectric material;
    at least one spacer between the bitlines contacts and the wordline adjacent to the bitline contacts.

2. The memory array of claim 1 wherein the charge-trapping dielectric material comprises:
    a bottom dielectric layer formed over the substrate;
    a charge-trapping layer formed over the bottom dielectric layer; and
    a top dielectric layer formed over the charge-trapping layer.

3. The memory array of claim 1 wherein the charge-trapping dielectric material comprises:
    a bottom oxide layer formed over the substrate;
    a nitride layer formed over the bottom oxide layer; and
    a top oxide layer formed over the nitride layer.

4. The memory array of claim 1 wherein the at least one spacer is formed over the top dielectric layer.

5. The memory array of claim 1 wherein a spacer separates the edge wordline from the contacts of more than one bitline.

6. The memory array of claim 1 wherein the spacers are have a stoichiometry of $Si_3N_4$.

7. The memory array of claim 1 wherein the spacers range from about 250 angstroms to about 1300 angstroms.

8. The memory array of claim 1 wherein the spacers range from about 750 angstroms to about 1200 angstroms.

9. The method array of claim 1 wherein the spacer is about the same height as the wordline material.

10. The memory array of claim 1 wherein the spacers are formed over the top dielectric layer.

11. The memory array of claim 1 wherein the spacers comprise one or more of: silicon nitride, silicon rich nitride, and SiON.

12. The memory array of claim 1 wherein the spacers are have a stoichiometry of $Si_3N_4$.

13. The memory array of claim 1 wherein the charge-trapping memory cells are dual-bit memory cells.

14. The memory array of claim 1 wherein the charge-trapping memory cells are floating gate memory cells.

15. The memory array of claim 1 wherein the array is an memory block having a size of $2^{(n+1)}K$ where n is an integer greater than 0.

16. The memory array of claim 15 wherein the array is a plurality connected memory blocks.

17. A method for forming a memory array comprising the steps of:
    providing a substrate;
    forming a charge-trapping dielectric material over the substrate;
    forming a plurality of bitlines having contact locations;
    forming wordlines over the charge-trapping dielectric material; and
    forming spacers between the bitline contact locations and wordlines adjacent to bitline contact locations;
    forming bitline contacts at the bitline contact locations.

18. The method of claim 17 wherein the step of forming a charge-trapping dielectric material comprises the steps of:
    forming a bottom dielectric layer above the substrate;
    forming a charge-trapping layer formed over the bottom dielectric layer; and
    forming a top dielectric layer over the charge storage layer.

19. The method of claim 17 further comprising the step of forming an etch stop layer above the spacer and the gate electrode.

20. The method of claim 19 wherein the etch stop layers are formed prior to forming the bitline contacts.

* * * * *